US012699125B2

(12) United States Patent
Griot et al.

(10) Patent No.: US 12,699,125 B2
(45) Date of Patent: Aug. 4, 2026

(54) DEVICE FOR MONITORING THE OPERATION OF ELECTRICAL CABLES IN A MESHED NETWORK

(71) Applicant: NEXANS, Courbevoie (FR)

(72) Inventors: Samuel Griot, Lyons (FR); Dimitri Charrier, Lyons (FR); Moussa Kafal, Les Ulis (FR)

(73) Assignee: NEXANS, Courbevoie (FR)

( * ) Notice: Subject to any disclaimer, the term of this patent is extended or adjusted under 35 U.S.C. 154(b) by 226 days.

(21) Appl. No.: 18/138,622

(22) Filed: Apr. 24, 2023

(65) Prior Publication Data

US 2023/0384358 A1      Nov. 30, 2023

(30) Foreign Application Priority Data

Apr. 26, 2022      (FR) ...................................... 2203851

(51) Int. Cl.
*G01R 31/08* (2020.01)
*G01R 31/12* (2020.01)

(52) U.S. Cl.
CPC ........... *G01R 31/086* (2013.01); *G01R 31/08* (2013.01); *G01R 31/12* (2013.01); *G01R 31/1272* (2013.01)

(58) Field of Classification Search
CPC ...... G01R 31/086; G01R 31/08; G01R 31/12; G01R 31/1272
See application file for complete search history.

(56) References Cited

U.S. PATENT DOCUMENTS

| | | | |
|---|---|---|---|
| 2003/0206111 A1 | 11/2003 | Gao et al. | |
| 2010/0073008 A1* | 3/2010 | Twerdochlib | ...... G01R 31/1272 324/520 |
| 2021/0190850 A1 | 6/2021 | Gundel et al. | |

FOREIGN PATENT DOCUMENTS

WO      2016/190823      12/2016

OTHER PUBLICATIONS

Shafiq Muhammad et al: "Integration of online proactive diagnostic scheme for partial discharge in distribution networks", IEEE Transactions on Dielectrics and Electrical Insulation, IEEE Service Center, Piscataway, Feb. 1, 2015.
Shafiq Met Al: "Partial discharge signal propagation in medium voltage branched cable feeder", IEEE Electrical Insulation Magazine, IEEE Nov. 1, 2018.
Shafiq Met Al: "Online partial discharge diagnostics in medium voltage branched cable networks", 4th International Conference on Power Engineering, Energy and Electrical Drives, IEEE, May 13, 2013.
Furse Cynthia Met Al: "Fault Diagnosis for Electrical Systems and Power Networks: A Review", IEEE Sensors Journal, IEEE; Apr. 13, 2020.
International Search Report dated Dec. 12, 2022.

* cited by examiner

*Primary Examiner* — Amy He
(74) *Attorney, Agent, or Firm* — MUNCY, GEISSLER, OLDS & LOWE, P.C.

(57) ABSTRACT

A device (10) for monitoring the operation of a plurality of electrical cables, connection or coupling accessories, switchgear and transformers, included in a meshed electrical network, has a plurality of end branches (16) and a plurality of intermediate branches (14) comprises the meshed electrical network, at least two inductive sensors (12) suitable for detecting a partial discharge occurring in the meshed electrical network and a means (18) for locating the source of the partial discharge (PD).

11 Claims, 2 Drawing Sheets

DEVICE FOR MONITORING THE OPERATION OF ELECTRICAL CABLES IN A MESHED NETWORK

RELATED APPLICATION

This application claims the benefit of priority from French Patent Application No. 22 03851, filed on Apr. 26, 2022, the entirety of which is incorporated by reference.

FIELD OF THE INVENTION

The present invention relates to a device for monitoring the operation of electrical cables in a meshed network. More particularly, the present invention relates to the monitoring of the operation of all of the electrical cables, connection or coupling accessories, switchgear and transformers in a meshed electrical network, for example at medium voltage or HTA (High Voltage A). This assembly is hereinafter called electrical network.

The invention belongs to the field of the power electrical networks intended to transport energy. It is applicable in particular, but not uniquely, in the field of energy distribution through HTA medium-voltage electrical networks and medium-voltage industrial electrical networks.

DESCRIPTION OF RELATED ART

Assessing the health of an electrical network and of an installation comprising cables, connection accessories, switchgear and transformers is an arduous task, in particular for a significant quantity of aging installations. Clients want to obtain information that is reliable and accurate regarding the electrical network.

There are off-connection and on-site services which make it possible to assess the health of a cable at a given location of a given cable. Nevertheless, these are spot assessments, which are valid only for a limited time. Furthermore, such techniques can be applied only to cables that are not live and can therefore not indicate the degradation of the electrical network in real time.

Moreover, currently, there are on the market a few systems for the online measurement of parameters relating to the good condition of a cable. However, these systems are limited to diagnosing a single cable and entail providing two sensors per cable. Monitoring a large number of cables therefore involves using a large number of sensors, which increases the cost and the complexity of the monitoring system.

When wanting to monitor more than one cable in a meshed electrical network, a reflectometry technique can be used. However, the reflectometry used as active test technique based on the injection of test signals is capable of locating faults in the cables, in the form of fraying, damage to insulation, cracks, etc. This technique is generally less sensitive to the weak points than those that generate partial discharges. This technique is therefore less appropriate and clearly less sensitive to measuring signals that are precursors of the aging of the electrical networks.

Objects and Summary

The aim of the present invention is to remedy the above-mentioned drawbacks of the prior art.

To this end, the present invention proposes a device for monitoring the operation of a plurality of electrical cables, connection or coupling accessories, switchgear and transformers included in a meshed electrical network comprising a plurality of end branches and a plurality of intermediate branches, the device comprising the meshed electrical network and being noteworthy in that it further comprises:

at least two inductive sensors suitable for detecting a partial discharge occurring in the meshed electrical network;

a means for locating the source of the partial discharge.

This device does not involve any condition regarding the powering of the cables, is not restricted to a single and linear cable topology and makes it possible to optimize the quantity of sensors. The analysis of the partial discharge signals makes it possible to simply identify the presence of anomalies or of weak points in the meshed electrical network.

Furthermore, this device eliminates the need to provide two sensors per cable and thus makes it possible to reduce the complexity of the installation and the human operations required to monitor the meshed electrical network considered.

In a particular embodiment, the at least two inductive sensors are high-frequency current transformers.

The bandwidth of such sensors extends from a few hundreds of kHz to approximately 100 MHz, which is particularly well suited to the pulse frequencies of the partial discharges due to the anomalies likely to occur in the electrical networks.

In a particular embodiment, the at least two inductive sensors are placed only on intermediate branches of the meshed electrical network.

That makes it possible to reduce the number of inductive sensors while avoiding encountering any difficulty of accessibility to certain end branches of the meshed electrical network to connect a sensor thereto, bearing in mind that, in any case, the probability of detecting an anomaly does not depend on the distance between the location of this anomaly and the sensors and that an anomaly situated on the direct path between two sensors will be systematically located.

In a particular embodiment, the plurality of end branches and the plurality of intermediate branches comprise a subset of branches to be monitored as a priority and the at least two inductive sensors are placed in the meshed electrical network in such a way that each branch of the subset of branches to be monitored as a priority is contained between two sensors of the at least two inductive sensors.

This feature relating to the positioning of the inductive sensors in the meshed electrical network is advantageous because it allows the systematic detection of any anomaly in any branch to be monitored as a priority. The branches to be monitored as a priority of those which comprise cables, connection or coupling accessories, switchgear or transformers corresponding to crucial functions, that is to say where a malfunction would have a significant impact for the client, even might present a serious risk in terms of continuity of service.

In a particular embodiment, the at least two inductive sensors are placed in the meshed electrical network so as to maximize the number of intermediate branches contained between two sensors of the at least two inductive sensors.

This other feature relating to the positioning of the inductive sensors in the meshed electrical network is advantageous because it makes it possible to maximize the detection of anomalies in the intermediate or derivative branches of the meshed electrical network, knowing that an anomaly situated between two sensors will be systematically located.

In a particular embodiment, the at least two inductive sensors are placed as a priority on the branches of the meshed electrical network which have the greatest lengths.

That makes it possible to maximize the link length covered by the monitoring device.

In a particular embodiment, the meshed electrical network comprises a number of inductive sensors less than the number of end branches and a number of end branches less than the number of intermediate branches.

That makes it possible to minimize the number of inductive sensors while monitoring sufficient coverage of the meshed electrical network.

In a particular embodiment, the means for locating the source of the partial discharge is adapted to apply a time-of-flight algorithm.

This algorithm, which makes it possible to know the time elapsed between the transmission and the reception of a signal, thus provides an accurate indication of the location of the meshed electrical network where the anomaly which provoked the partial discharge occurred.

BRIEF DESCRIPTIONS OF THE DRAWINGS

Other aspects and advantages of the invention will become apparent on reading the following detailed description of particular embodiments, given as nonlimiting examples, with reference to the attached drawings, in which.

DETAILED DESCRIPTION

The device according to the present invention is a device for monitoring the operation of a plurality of electrical cables, connection or coupling accessories, switchgear and transformers included in a meshed electrical network.

Figure 1:
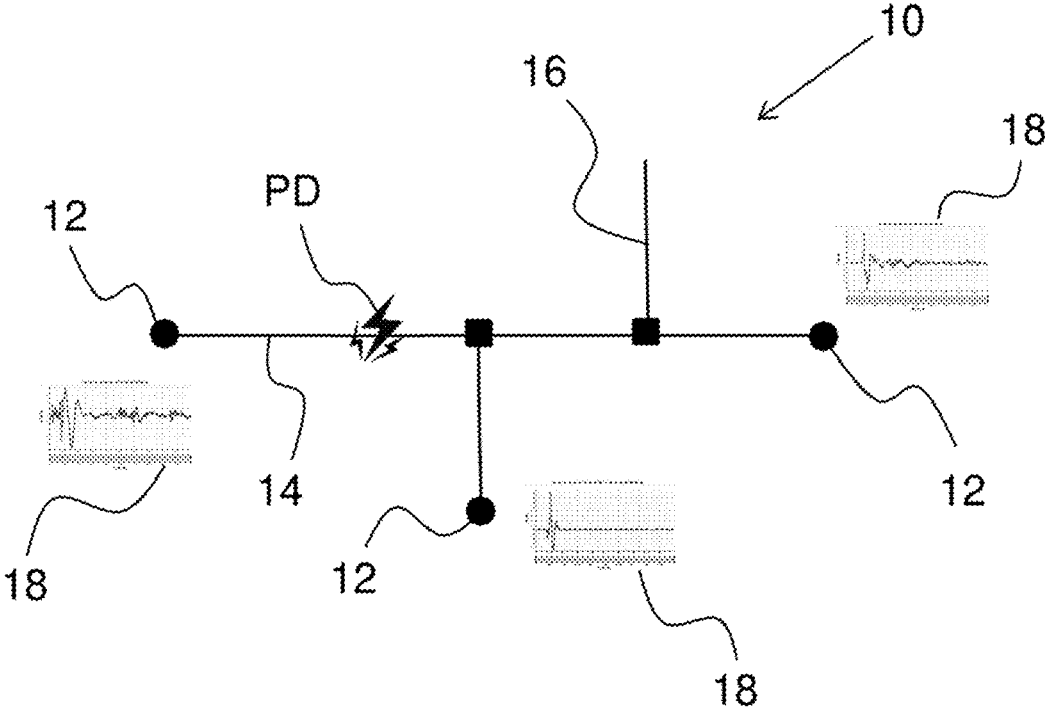
FIG. 1 is a partial schematic representation of a meshed electrical network included in a device according to the present invention showing the features of such a device, in a particular embodiment.

As FIG. 1 shows, the meshed electrical network comprises a plurality of end branches 16 and a plurality of intermediate branches 14. An intermediate branch 14 is defined as not being an end branch.

The monitoring device 10 comprises the meshed electrical network.

In accordance with the present invention, the device 10 further comprises at least two inductive sensors 12 suitable for detecting a partial discharge PD occurring in the meshed electrical network.

The analysis of the graph representing the partial discharge signal makes it possible to identify the presence of an anomaly or of a weak point in a cable or other electrical equipment of the meshed electrical network. This graph can for example represent the amplitude as a function of time of the electromagnetic pulse from the partial discharge PD transformed into a current signal.

As a nonlimiting example, the inductive sensors 12 can be high-frequency current transformers, or HFCT, used here as inductive coupling sensors and fixed at predefined locations of the meshed electrical network.

In accordance with the present invention, the device 10 also comprises a means 18 for locating the source of the partial discharge PD.

As a nonlimiting example, the means 18 for locating the source of the partial discharge PD can be adapted to apply a time-of-flight algorithm. It consists, as is known per se, in transmitting a signal, obtaining the travel time of this signal between its transmission and its reception and deducing therefrom the location of the partial discharge PD in the meshed electrical network, which makes it possible to identify the cable or other electrical equipment which has suffered the anomaly which provoked this partial discharge PD.

In a particular embodiment, the inductive sensors 12 can be placed only on intermediate branches 14 of the meshed electrical network. Indeed, the connecting of sensors at all the ends of a meshed electrical network is costly and it is not always possible based on the accessibility of these branches.

In a particular embodiment, in order to maximize the probability of detecting an anomaly on an intermediate branch 14 of the meshed electrical network, the inductive sensors 12 can be placed in the meshed electrical network so as to maximize the number of intermediate branches 14 or derivatives contained between two inductive sensors 12.

In a particular embodiment, the set of branches composed of the plurality of end branches 16 and of the plurality of intermediate branches 14 comprises a subset of branches to be monitored as a priority. This subset is defined according to the importance, for the correct operation of the meshed electrical network, of the electrical equipment and of the cables present on these branches and the importance of the impact of a malfunction on the meshed electrical network. On the other hand a decision will be made for a branch not to be monitored as a priority if, in the event of failure on this branch, the network can continue to operate, even in degraded mode.

In this embodiment, the inductive sensors 12 are then placed in the meshed electrical network in such a way that each branch of the subset of branches to be monitored as a priority is contained between two inductive sensors 12. Thus, these inductive sensors 12 will systematically detect any partial discharge PD on all the branches to be monitored as a priority.

In a particular embodiment, in order to optimize the coverage of the monitoring of the meshed electrical network by the device 10 according to the present invention, the inductive sensors 12 can be placed as a priority on the branches of the meshed electrical network which have the greatest lengths.

As a nonlimiting example, the meshed electrical network can comprise a number K of inductive sensors 12 less than the number M of end branches 14 and a number M of end branches 16 less than the number N of intermediate branches 14.

Two main factors can be distinguished in deciding the positioning and the number of inductive sensors 12.

The first factor lies in the nature of the electrical equipment connected to the meshed electrical network (transformer, switching device, etc) and the situation of the cable itself (separate phases, single bundle, etc). This first factor makes it possible to specify the best location for fixing the sensor and also the conductors that are most appropriate to be monitored (phase to phase, phase to shielding, etc).

The second factor is determined by the propagation characteristics of the partial discharge PD pulses in the cable being monitored. More specifically, the assumptions of strongest attenuation and of greatest scattering are taken into account and, by projection of these assumptions onto the event which caused the partial discharge PD, the optimal number of inductive sensors 12 for a given network can be defined.

Figure 2:
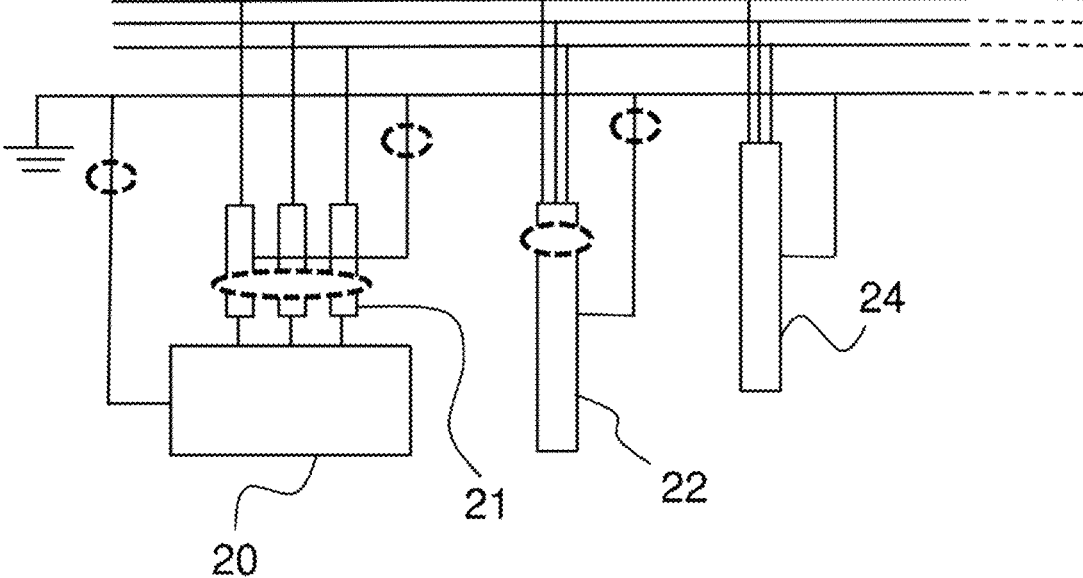
FIG. 2 is a partial schematic representation of a meshed electrical network included in a device according to the present invention showing possible locations for the sensors, in another particular embodiment.

In FIG. 2, the ellipses in dotted lines illustrate possible locations for the inductive sensors 12. The element 20 is an electrical device, the element 21 designates output cables from the electrical element 20, the element 22 is a cable to be monitored and the element 24 is another cable, for example a medium-voltage cable.

As a nonlimiting example, the process for determining the location of the inductive sensors 12 can be as follows:

identify the branches of the meshed electrical network that have a high priority level, identify the intermediate branches 14 of the meshed electrical network, sort the branches according to their length, insofar as is possible, place the inductive sensors 12 in such a way that the branches with high priority are contained between at least two inductive sensors 12, place the inductive sensors 12 so as to maximize the number of intermediate branches 14 contained between at least two inductive sensors 12, place the remaining inductive sensors 12 on the other branches of the meshed electrical network, beginning with the branches of greatest length.

By following such a process, the number of branches monitored is maximized, as is the monitored length. The branches that are not monitored will be mostly end branches 16, considered to exhibit a lesser risk and be shorter than the monitored branches.

The invention claimed is:

1. A device for monitoring the operation of a plurality of electrical cables, connection or coupling accessories, switchgear and transformers included in a meshed electrical network comprising a plurality of branches comprising a plurality of end branches and a plurality of intermediate branches, said end branches having only one end connected to one of the branches whereby one of the intermediate branches and said intermediate branches having two ends each connected to one of the branches, said device comprising:

said meshed network;

at least two inductive sensors suitable for detecting a partial discharge occurring in said meshed electrical network; and a means for locating the source of said partial discharge.

2. The device according to claim 1, wherein said at least two inductive sensors are high-frequency current transformers.

3. The device according to claim 1, wherein said at least two inductive sensors are placed only on intermediate branches of said meshed electrical network.

4. The device according to claim 1, wherein said plurality of end branches and said plurality of intermediate branches comprise a subset of branches to be monitored as a priority and in that said at least two inductive sensors are placed in said meshed electrical network in such a way that each branch of said subset of branches to be monitored as a priority is contained between two sensors of said at least two inductive sensors.

5. The device according to claim 1, wherein said at least two inductive sensors are placed in said meshed electrical network in such a way as to maximize the number of intermediate branches contained between two sensors of said at least two inductive sensors.

6. The device according to claim 1, wherein said at least two inductive sensors are placed as a priority on the branches of said meshed electrical network which have the greatest lengths.

7. The device according to claim 1, wherein said meshed electrical network comprises a number of inductive sensors less than the number of end branches and a number of end branches less than the number of intermediate branches.

8. The device according to claim 1, wherein said means for locating the source of said partial discharge is adapted to apply a time-of-flight algorithm.

9. A device for monitoring the operation of a plurality of electrical cables, connection or coupling accessories, switchgear and transformers included in a meshed electrical network comprising a plurality of branches comprising a plurality of end branches and a plurality of intermediate branches, said end branches having only one end connected to one of the branches whereby one of the intermediate branches and said intermediate branches having two ends each connected to one of the branches, said device comprising:

said meshed network;

at least two inductive sensors suitable for detecting a partial discharge occurring in said meshed electrical network, said at least two inductive sensors are placed only on intermediate branches of said meshed electrical network; and a means for locating the source of said partial discharge.

10. A device for monitoring the operation of a plurality of electrical cables, connection or coupling accessories, switchgear and transformers included in a meshed electrical network comprising a plurality of branches including a plurality of end branches and a plurality of intermediate branches comprising at least one intermediate branch to which are connected several end branches of the plurality of end branches, said end branches having only one end connected to one of the branches, said device comprising:

said meshed network;

at least two inductive sensors suitable for detecting a partial discharge occurring in said meshed electrical network, said at least two inductive sensors are placed on said intermediate branch to which are connected several end branches of the plurality of end branches so that several end branches are contained between the two inductive sensors; and a means for locating the source of said partial discharge.

11. A device for monitoring the operation of a plurality of electrical cables and pieces of electrical equipment included in a meshed electrical network comprising a plurality of branches comprising a plurality of end branches and a plurality of intermediate branches, said end branches having only one end connected to one of the branches whereby one of the intermediate branches and said intermediate branches having two ends each connected to one of the branches, said device comprising:

said meshed network;

at least two inductive sensors suitable for detecting a partial discharge occurring in said meshed electrical network; and a means for locating the source of said partial discharge, adapted to apply a time-of-flight algorithm, comprising transmitting a signal, obtaining the travel time of this signal between its transmission and its reception and deducing therefrom the location of the partial discharge in the meshed electrical network and identifying the cable or other piece of electrical equipment which has suffered anomaly which provoked this partial discharge.

* * * * *